United States Patent [19]

Levin

[11] Patent Number: 5,590,069

[45] Date of Patent: Dec. 31, 1996

[54] METHOD AND APPARATUS FOR PROVIDING ROM IN AN INTEGRATED CIRCUIT HAVING UPDATE THROUGH SINGLE SUBSTANCE LAYER MODIFICATION CAPABILITY

[75] Inventor: Jeffrey A. Levin, San Diego, Calif.

[73] Assignee: Qualcomm Incorporated, San Diego, Calif.

[21] Appl. No.: 324,433

[22] Filed: Oct. 17, 1994

[51] Int. Cl.$^6$ ........................................... G11C 17/00
[52] U.S. Cl. ........................................ 365/96; 365/94
[58] Field of Search ..................... 365/94, 96; 257/390; 326/38, 41, 40, 39

[56] References Cited

U.S. PATENT DOCUMENTS 5,012,135  4/1991  Kaplinsky .................... 326/38
5,028,821  7/1991  Kaplinsky .................... 326/41
5,378,904  1/1995  Suzuki .......................... 326/41

*Primary Examiner*—A. Zarabian
*Attorney, Agent, or Firm*—Russell B. Miller; Brian S. Edmonston

[57] ABSTRACT

A ROM circuit that can be modified via the alteration of any one of a set of substance layers is described. The ROM circuit includes a set of ROM cells each of which provide one bit of data used to construct the fixed binary number. Each ROM cell includes a set of circuits that can be placed in either a first or second state via modification of a single substance layer that is different for each circuit, and generates a signal in a logic state that depends on whether the number of circuits in the first state is odd or even. When a design revision occurs the state of one of the circuits from the set of circuits is modified to update the fixed binary number using one of the substance layer already being modified during the course of the design revision.

23 Claims, 6 Drawing Sheets

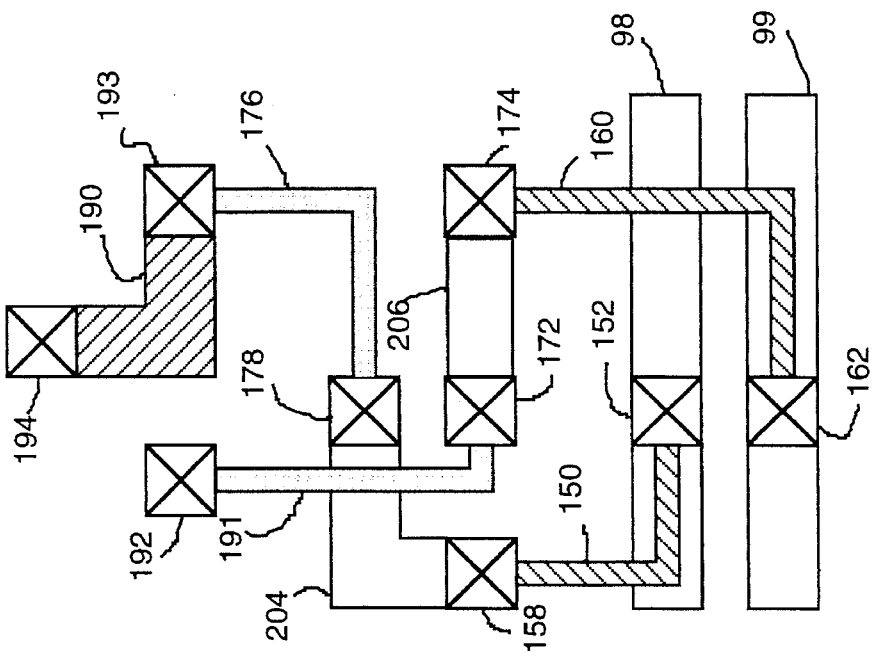
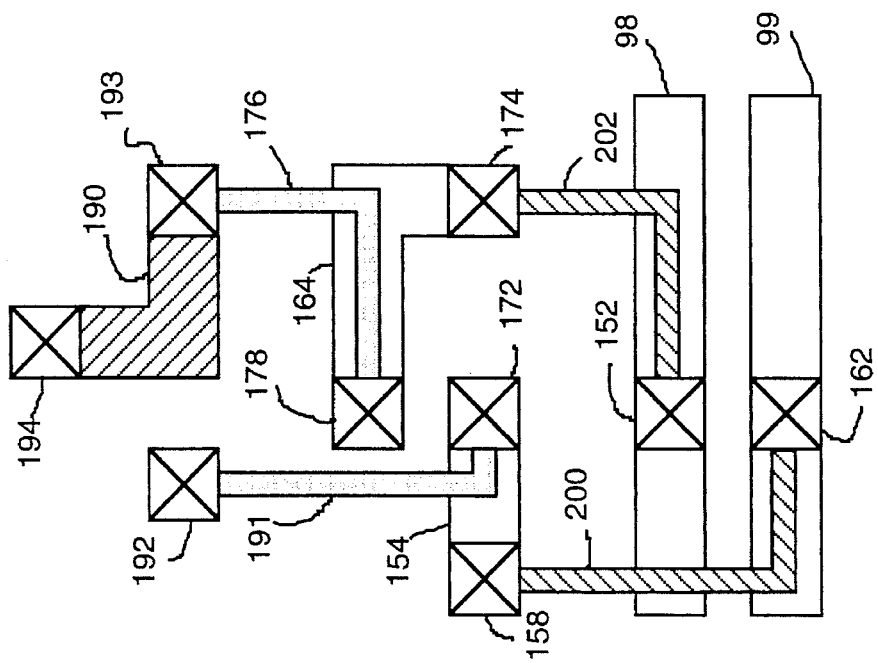
*FIG. 5B*
*FIG. 5A*

METHOD AND APPARATUS FOR PROVIDING ROM IN AN INTEGRATED CIRCUIT HAVING UPDATE THROUGH SINGLE SUBSTANCE LAYER MODIFICATION CAPABILITY

BACKGROUND OF THE INVENTION

1. Field of the Invention

The described invention relates generally to the field of integrated circuits. More particularly, the described invention relates to a method and apparatus for providing permanent read-only memory storage in an integrated circuit that can be updated via the modification of any one of a set of substance layers used to fabricate the integrated circuit.

2. Description of the Related Art

Integrated circuits often incorporate the use of read-only memory (ROM) for storing information used during the operation and testing of the integrated circuit. This makes the information readily available when such operation and testing take place. Examples of the type of information commonly stored in this manner include device revision numbers that indicate the design revision used during fabrication of the integrated circuit and signature codes that are the results produced when a standard testing operation is performed on a properly operating sample of the integrated circuit. After receiving the information stored in ROM other systems interacting with the integrated circuit can respond in various predetermined ways that will increase the likelihood of proper testing of the integrated circuit and of proper operation of a system in which the integrated circuit is incorporated.

The usual method for incorporating ROM into an integrated circuit is to "hard-wire" a set of nodes within the integrated circuit to power and ground via one of the conductive substance layers used to manufacture the integrated circuit. Hard-wiring is preferred over other non-volatile methods of storage because it requires minimal circuit area. Any one of the conductive substance layers used to manufacture the integrated circuit can be used to perform this hard-wiring including any of the metal layers, usually labeled metal one, metal two, etc., as well as the poly-implant layer, often called the "poly" layer. When power is applied to the integrated circuit a binary number is generated on the set of nodes through the hard-wired connections. This binary number is then applied to output circuitry within the integrated circuit such that it may be received by other circuits and systems located externally.

The use of a metal or other conductive substance layer to hard-wire a binary number as described above, however, can cause problems when changes are required during the design development of the integrated circuit. This is because a design revision often requires revision of the information stored within ROM as well, and revising ROM may make it necessary to modify an additional substance layer that would not otherwise require modification when the design revision is performed. For example, if the design revision only requires modification of a metal three layer, but the ROM was generated by hard-wiring with the metal one layer, the overall revision would require modification of both the metal one layer and metal three layer, as opposed to just the metal three layer.

Modifying an additional substance layer within the integrated circuit increases the cost of a design revision because a photo-lithographic mask ("mask") must be generated for each modified substance layer and mask generation is an expensive process. Additionally, once a particular mask has been determined defect free it is undesirable and risky to replace that mask. Although the process of updating the revision numbers and other information permanently stored within ROM may be foregone to avoid this increase in cost and risk, the stored information will then become less accurate and provide less utility, which in turn will decrease the reliability and testability of the integrated circuit. An improved method of permanently storing information within an integrated circuit would allow modification of that information during the course of a design revision to be performed without requiring modification of substance layers not already being altered. Additionally, since the number of design revisions or updates an integrated circuit will go through is indeterminable, this improved method should allow multiple updates to be performed in series. Thus, it is highly desirable to provide a ROM that can be updated an infinite number of times via modification of any one of a set of substance layers used to fabricate an integrated circuit.

SUMMARY OF THE INVENTION

Based on the forgoing, a ROM circuit that generates a fixed binary number that can be modified via the alteration of any one of a set of substance layers is described. The ROM circuit includes a set of ROM cells each of which provides one bit of data used to construct the fixed binary number. Each ROM cell includes a set of circuits that can be placed in either a first or second state via modification of a single substance layer that is different for each circuit, and each ROM cell generates a signal in a logic state that depends on whether the number of circuits in the first state is odd or even. When a design revision is required the state of one of the circuits in each ROM cell can be modified as necessary using a substance layer that is already being modified during the course of the design revision. This changes the logic state of the output node of each ROM cell as necessary to update the fixed binary number without adding to the cost of the design revision.

BRIEF DESCRIPTION OF THE DRAWINGS

FIGS. 5a–d are illustrations of the layout of a ROM cell configured to generate a logic one via modification of various substance layers in accordance with one embodiment of the invention.

DETAILED DESCRIPTION OF THE PREFERRED EMBODIMENTS

Figure 1:
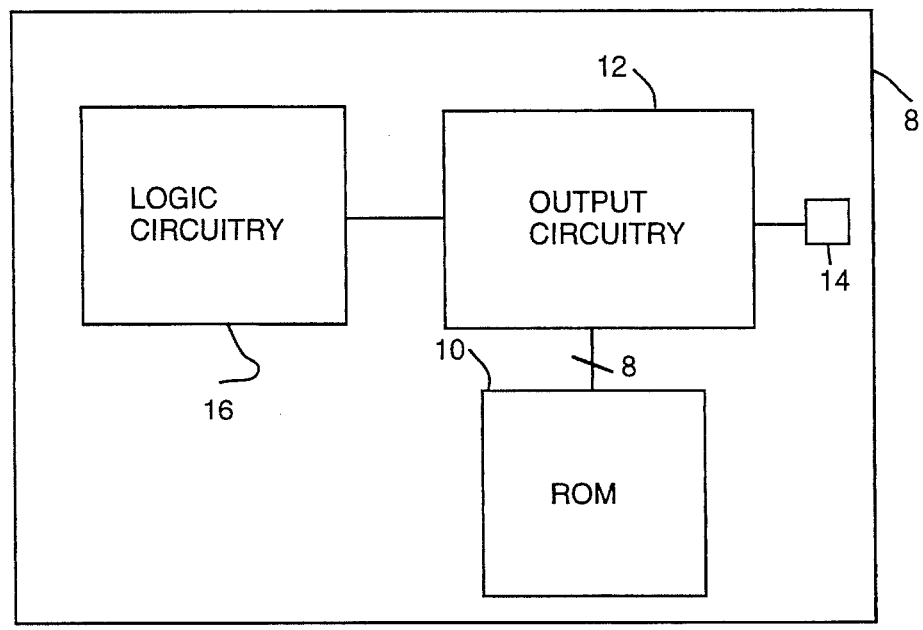
FIG. 1 is a block diagram of an integrated circuit configured in accordance with one embodiment of the invention.

FIG. 1 is a block diagram of an integrated circuit 8 configured in accordance with one embodiment of the invention. Output circuitry 12 receives a fixed binary number from read-only memory (ROM) 10 and transmits it to output pad 14. This fixed binary number remains constant for the life of the integrated circuit barring any physical damage and can represent any type of data for which permanent storage within an integrated circuit is desirable including a device revision number or a device signature code. Additionally, output circuitry 12 receives other information from logic circuitry 14 that is also transmitted to output pad 16. In an alternative embodiment it is also contemplated that ROM 10 is coupled directly to output pad 14, but the configuration shown is preferred because it allows information from multiple sources to be transmitted from output pad 14.

Figure 2:
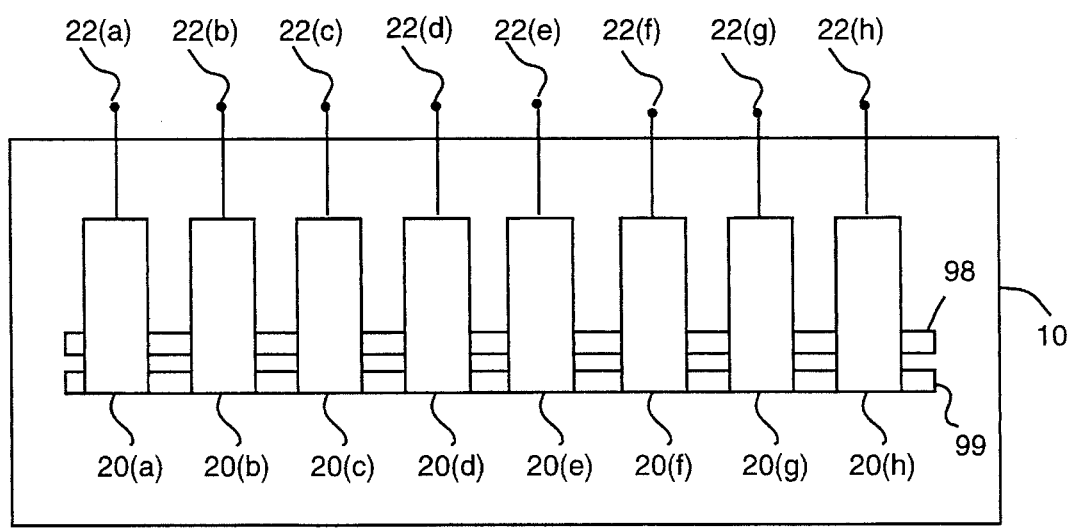
FIG. 2 is a block diagram of a read-only memory (ROM) for storing information in the integrated circuit of two fixed bit generation circuits configured to generate a logic zero and a logic one.

FIG. 2 is a block diagram of ROM 10 configured in accordance with one embodiment of the invention. ROM cells 20(a) through (g) are coupled to Vdd source 98 and Ground source 99 and generate a set of logic values on output nodes 22(a) through (g) that form an 8 bit binary number which is fed to output circuitry 12 of FIG. 1. Each of the ROM cells 20(a) through (g) are "hard-wired" such that they can not be changed by mere application of signals from an outside source, and the logic values they generate will remain the same whenever power is applied. While ROM 10 is shown providing an 8 bit binary number other embodiments of the invention generating binary numbers having any number of bits via the addition or removal of ROM cells 20 are contemplated including circuits generating one, four, twelve, sixteen, and thirty-two bits.

Figure 3:
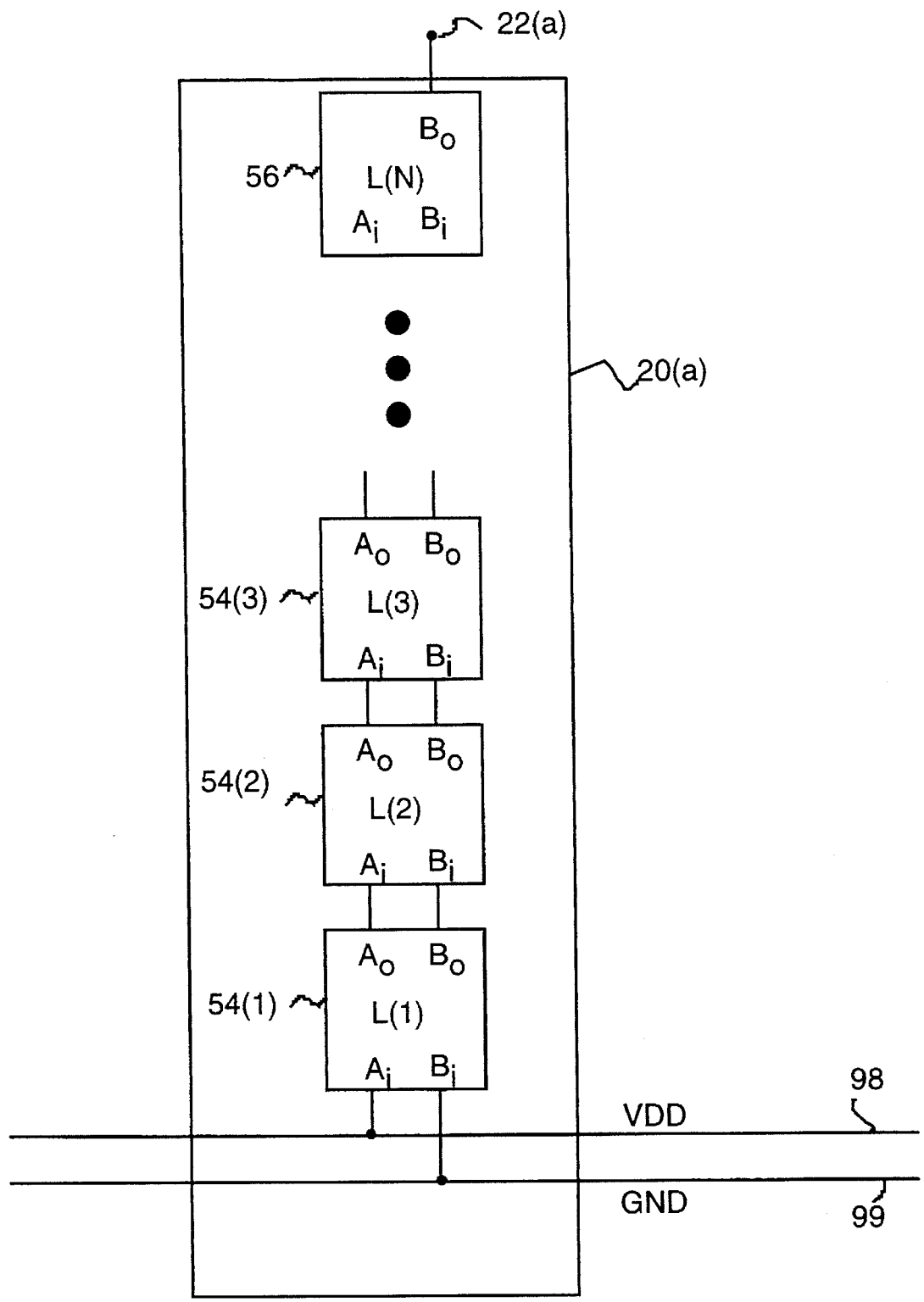
FIG. 3 is a block diagram of a ROM cell configured in accordance with all embodiments of the invention.

FIG. 3 is a block diagram illustrating the configuration of ROM cell 20(a) of FIG. 2. The $A_i$ input of circuit 54(1) is coupled to Vdd source 98 and the $B_i$ input of circuit 54(1) is coupled to Ground source 99. The $A_i$ input of circuit 54(2) is coupled to the $A_o$ output of circuit 54(1) and the $B_i$ input of circuit 54(2) is coupled to the $B_o$ output of circuit 54(1). Circuit 54(3) has its $A_i$ input coupled to the $A_o$ output of circuit 54(2) and its $B_i$ input coupled to the $B_o$ output of circuit 54(2). In one embodiment of the invention the $A_o$ and $B_o$ outputs of circuit 54(3) are coupled directly to the $A_i$ and $B_i$ inputs of circuit 56, however, in alternative embodiments additional circuits 54 are added in similar fashion to circuit 54(3) with their $A_i$ and $B_i$ inputs coupled to the $A_o$ and $B_o$ outputs of the previous circuit 54 respectively, and with their $A_o$ and $B_o$ outputs coupled to the $A_i$ and $B_i$ inputs of the next circuit 54 respectively, or circuit 56 respectively if it is the last circuit 54 in the chain. The $B_o$ output of circuit 56 forms output node 22(a) of FIG. 1.

Each one of circuits 54(1) through 54(3) can be configured in either a first or second state via modification of single substance layer used to fabricate integrated circuit 8 of FIG. 1 where that substance layer is different for each circuit. The state of each circuit 54(1) through 54(3) determines the manner in which each circuit transmits the logic low and logic high originally generated by Vdd source 98 and Ground source 99 from its $A_i$ and $B_i$ inputs to its $A_o$ and $B_o$ outputs. When configured in the first state, called the direct state, the logic level applied to the $A_i$ input is transmitted to the $A_o$ output and the logic level applied to the $B_i$ input is transmitted to the $B_o$ output thus keeping the logic levels at the output nodes the same as the logic levels at the respective input nodes. When configured in the second state, called the inverted state, the logic level applied to the $A_i$ input is transmitted to the $B_o$ output and the logic level applied to the $B_i$ input is transmitted to the $A_o$ output causing the logic levels at the output nodes to be the opposite or inverted with respect to the logic level at the corresponding input node.

Circuit 56 can also be configured in either a direct or an inverted state via modification of a single substance layer used to fabricate the integrated circuit 8 of FIG. 1. The substance layer used to perform this modification is different from that used to modify circuits 54(1) through (3). The logic level applied to the $B_i$ input is transmitted to the $B_o$ output in the direct state, and the logic level applied to the $A_i$ input is transmitted to the $B_o$ output in the inverted state. Since the logic high and logic low of Vdd source 98 and Ground source 99 will be applied to the Ai and Bi inputs of circuit 56 this will cause the Bo output to be inverted with respect to the $B_i$ input when circuit 56 in the inverted state, and to be the same as the $B_i$ input when circuit 56 in the direct state. The $B_o$ output of circuit 56 forms output node 22(a) of FIG. 2 that generates one bit of the binary number described above.

The above described configuration of ROM cell 20(a) allows the state of the Bo output of circuit 56 to be determined by the number of circuits 54(1) through (3) and 56 configured in the inverted state. If the number of circuits 54(1) through (3) and 56 in the inverted state is even (zero being an even number for purposes of this description) output node 22 will be logic low. This is because for each circuit in the inverted state switching the logic level of its $B_o$ output with respect to its $B_i$ input there is another circuit in the inverted state also switching the logic level of its $B_o$ output with respect to its $B_i$ input. The result of this even number of switches is that the $B_o$ output of the last circuit in the chain, circuit 56, is the same logic level as the $B_i$ input of first circuit in the chain, circuit 54(1), which in the described embodiment is coupled to Ground source 99 and therefore a logic low. If the number of circuits in the inverted state is odd, however, output node 22 will be logic high. This is because there is an unmatched circuit in the inverted state that inverts its $B_o$ output with respect to its $B_i$ input. This causes the $B_o$ output of the last circuit in the chain, circuit 56, to be at the same logic level the $A_i$ input of the first circuit in the chain, circuit 54(1), which in the described embodiment is coupled to Vdd source 98 and therefore logic high.

To generate a binary number using ROM 10 each of ROM cells 20(a) through (g) are configured to generate either a logic one or a logic zero as appropriate for the particular binary by configuring them with either an odd or even number of circuits 54 and 56 in the inverted state. Integrated circuit 8 of FIG. 1 is then fabricated with ROM 10 configured in this manner and the binary number generated is read through output circuit 12 by other systems and circuits located externally. If a design revision of integrated circuit 8 subsequently requires the binary number be updated the number of circuits 54 and 56 in the inverted state within each ROM cell 20 can be changed from odd to even or even to odd, as necessary, by changing the state of any one of those circuits 54 or 56 within those ROM cells. For example, if a design update required the layer used to modify circuit 54(2) be revised, the logic level of output node 22 could be changed without modifying any other substance layer by also changing the state of circuit 54(2) during that design revision.

Since either changing a circuit 54 or 56 in the inverted state to the direct state, or changing a circuit in the direct state to the inverted state, will change the number of circuits in the inverted state from either odd to even, or even to odd, modification of only a single circuit 54 or 56 within each ROM cell requiring updating will be necessary to change the logic level of corresponding output node 22. By changing the state of only those circuits 54 or 56 within each ROM cell 20 that can be changed via modification of a substance layer already being modified in the course of the design revision the binary number can be updated at little or no additional cost. This update process may be repeated an infinite number of times because ROM cells 20 always have either an odd or even number of circuits 54 and 56 in the inverted state, and therefore always can be updated by changing the state of any one of circuits 54 or 56. Also, additional circuits 54 can be added to the chain thereby increasing the number of substance layers that can by used to modify the logic level on output node 22.

Figure 4:
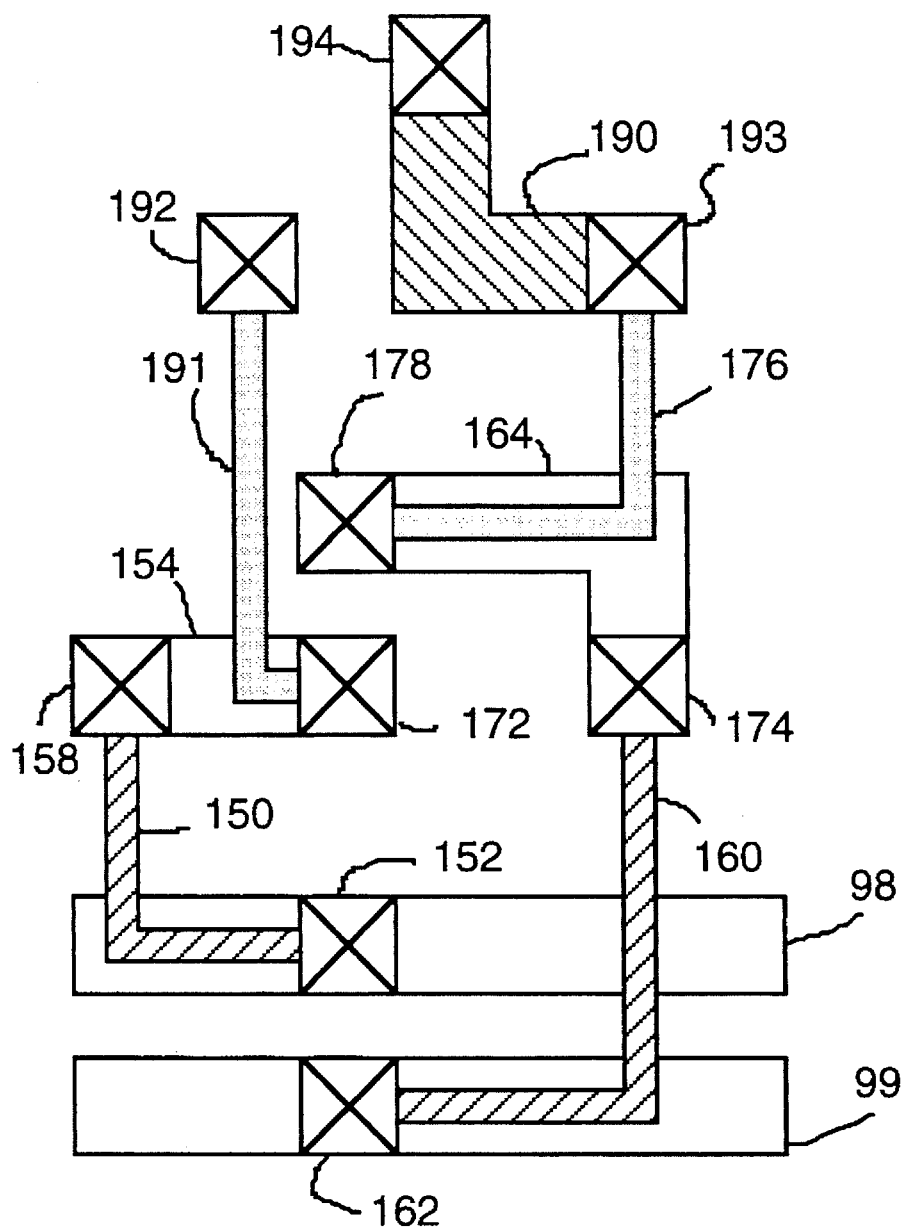
FIG. 4 is an illustration of the layout of a ROM cell configured to generate a logic zero in accordance with one embodiment of the invention.

FIG. 4 is an illustration the layout of ROM cell 20(a) configured to generate a logic zero in accordance with one embodiment of the invention and consistent with the circuit shown in FIG. 3. Poly sections 150 and 160 perform the described function of circuit 54(1) configured in the direct state by coupling the $A_i$ and $B_i$ inputs formed by contacts 152 and 162 respectively to the $A_o$ and $B_o$ outputs formed by contacts 158 and 174 respectively. Metal one sections 154 and 164 perform the described function of circuit 54(2) configured in the direct state by coupling the $A_i$ and $B_i$ inputs formed by contacts 158 and 174 respectively to $A_o$ and $B_o$ output formed by contacts 172 and 178 respectively. Metal two sections 191 and 176 perform the described-function of circuit 54(3) configured in the direct state by coupling the $A_i$ and $B_i$ inputs, formed by contacts 172 and 178 respectively to the $A_o$ and $B_o$ outputs, formed by contacts 192 and 193 respectively. Metal three section 190 performs the described function of circuit 56 configured in the direct state by coupling the $B_i$ input formed by contact 193 to the $B_o$ output formed by contact 194, which in turn forms output node 22(a) of FIG. 3. Contact 192 forms the $A_i$ input of circuit 56.

The layout described above places output node 22(a) in a logic low state by coupling contact 194 to Ground source 99 via a conductive strip formed by poly section 160, metal one section 164, metal two section 176, and metal three section 190. Placing output node 22(a) logic low in this situation is consistent with the above described operation of ROM cell 20(a) since the various sections provide the functional equivalent of circuit 54(1) through (3) and 56 each placed in the direct state making the number of circuits 54 and 56 in the inverted state zero. The intermediate node formed by contact 192 is coupled to Vdd source 98 through a second conductive strip formed by poly section 150, metal one section 154, and metal two section 191. This second conductive strip passes through all but one of the different substance layers placed in series used to construct the first conductive strip and can be used to couple output node 22(a) to Vdd source 98 when is it desirable to do so.

Figure 5C:
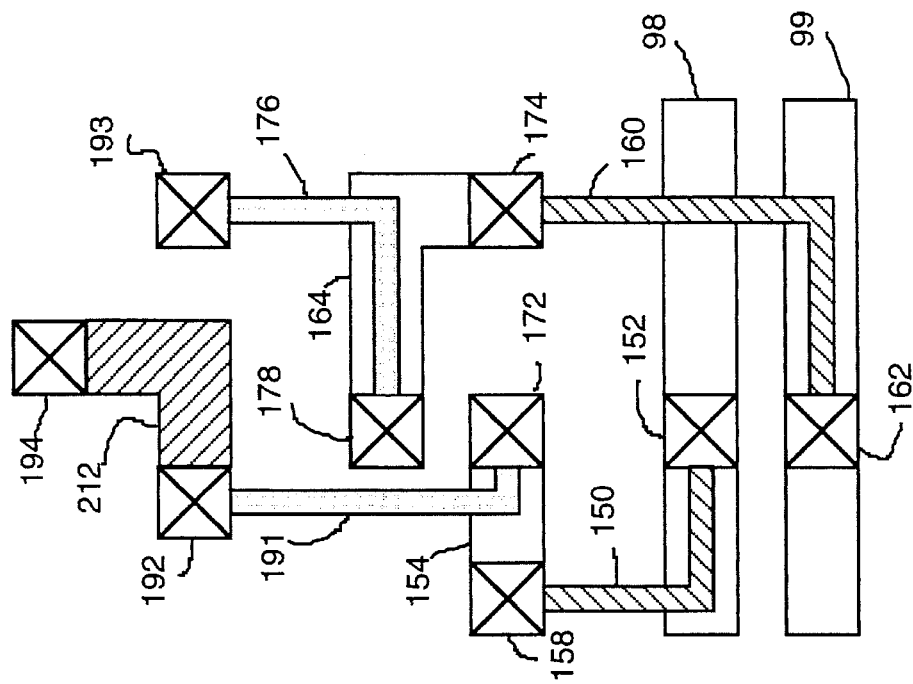

FIGS. 5a through 5d illustrate the layout of ROM cell 20(a) when the sections of a particular substance layer are configured to provide the functionality of one of circuits 54(1) through (3) or 56 in the inverted state in accordance with one embodiment of the invention. In FIG. 5a poly sections 200 and 202 replace poly sections 150 and 160 of FIG. 4 and provide the functionality of circuit 54(1) in the inverted state by coupling the $A_i$ and $B_i$ inputs formed by contacts 152 and 162 to the $B_o$ and $A_o$ outputs formed by contacts 158 and 174. This couples output node 22(a) to Vdd source 98 through the conductive strip formed by poly section 202, metal one section 164, metal two section 176, and metal three section 190, placed in series, and forms a second conductive strip through metal two section 191, metal one section 154, and poly section 200. All the remaining sections and contacts are the same as shown in FIG. 4 and thus the logic level of output node 22(a) has been changed via modification of the poly layer alone.

In FIG. 5b metal one sections 204 and 206 replace metal one sections 154 and 164 of FIG. 4 and provide the functionality of circuit 54(2) in the inverted state by coupling the $A_i$ and $B_i$ inputs formed by contacts 158 and 174, to the $B_o$ and $A_o$ outputs respectively formed by contacts 178 and 172. This couples output node 22 (a) to Vdd source 98 through the conductive strip formed by poly section 150, metal one section 204, metal two section 176, and metal three section 190 placed in series, and forms a second conductive strip through metal two section 191, metal one section 206, and poly section 160. All other sections and contacts are the same as shown in FIG. 4 and thus the logic level of output node 22(a) has been changed via modification of the metal one layer alone.

In FIG. 5c metal two sections 208 and 210 replace metal two sections 191 and 176 of FIG. 4 and provide the functionality of circuit 54(3) in the inverted state by coupling the $A_i$ and $B_i$ inputs formed by contacts 172 and 178 to the $B_o$ and $A_o$ outputs formed by contacts 193 and 192 respectively. This couples output node 22 to Vdd source 98 through the conductive strip formed by poly section 150, metal one section 154, metal two section 210, and metal three section 190 each coupled in series, and forms a second conductive strip through metal two section 208, metal one section 164, and poly section 160 that can be used to recouple output node 22 to Ground source 99 when such action is desirable. All other sections and contacts are the same as shown in FIG. 4 and thus the logic level of output node 22(a) has changed via modification of the metal two layer alone.

Figure 5D:
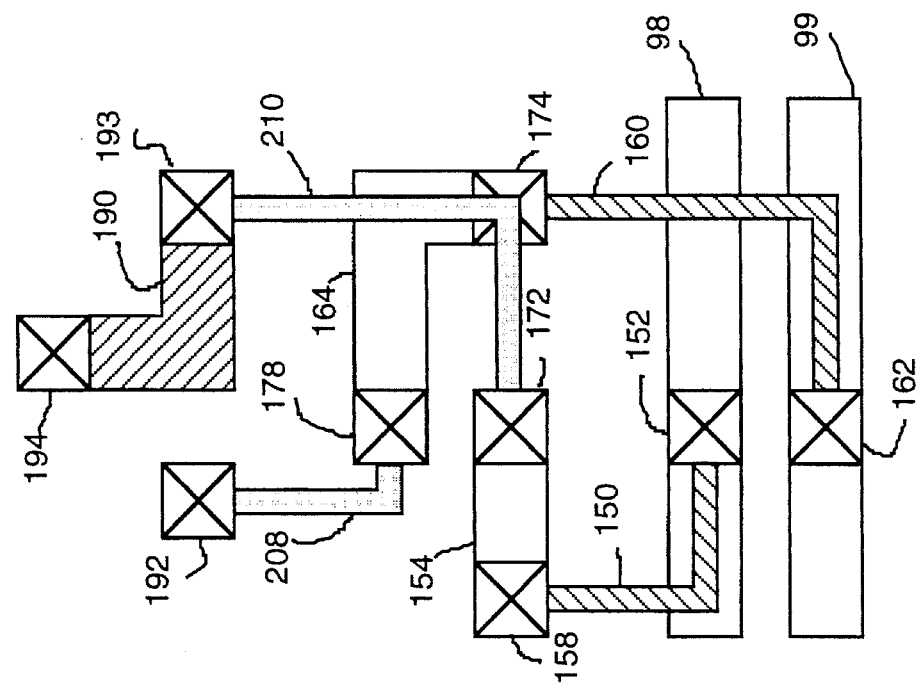

In FIG. 5d metal three section 212 replaces metal three section 190 of FIG. 4 and provides the functionality of circuit 56 in the inverted state by coupling the $A_i$ input formed by contact 192 to the $B_o$ output formed by contact 194. This couples output node 22(a) to Vdd source 98 through the conductive strip formed by poly section 150, metal one section 154, metal two section 191, and metal three section 212 each coupled in series, and forms a second conductive strip through metal two section 176, metal one section 164, and poly section 160. All other sections and contacts are the same as shown in FIG. 4 and thus the logic level in output node 22(a) has been changed via modification of the metal three layer alone.

As design revisions of integrated circuit 8 become necessary the logic level generated by ROM cell 20(a) can be updated by alternating the configuration the sections of a particular substance layer between one of the two arrangements for each shown above. This changes the state of the circuit 54(1) through (3) or circuit 56 for which those sections provide corresponding functionality, and has the effect of breaking the conductive strip coupling output node 22(a) to the original logic level and recoupling it to a source of the alternative logic level through a new conductive strip. Both the original conductive strip and the new conductive strip will be comprised of each conductive substance layer placed in series. Additionally, a second conductive strip that couples an intermediate node to the original logic source and that passes through all but one of conductive substance layer used to construct the first conductive strip is formed. This second conductive strip can be used to couple the output node back to the original logic source through every conductive substance layer and for forming another secondary conductive strip should the logic level of output node 22 require further change. Also, the alternating placement of the contacts on a center line and on either side of the center line allows for simplified layout of the ROM cell.

By implementing ROM cell 20(a) in the manner described above the benefits of easily updatable ROM 10 are obtained using a minimum of circuitry and power consumption. Since no transistors or other active logic circuits are required minimal circuit area is necessary to implement the ROM cell thereby increasing the amount of area available to implement other functionality on the integrated circuit. Also, because the ROM cell described contains no active logic circuitry a ROM circuit incorporating their use will consume a minimal amount of power. The use of no active logic circuitry also increases the ease with which such a circuit and can be manufactured more easily. Additionally, in the above described configuration each section of a particular substance is coupled to a section of a substance layer located immediately below it thus minimizing the depth and size of the contacts and therefore further enhancing the manufacturability of the ROM cell 20.

Figure 6:
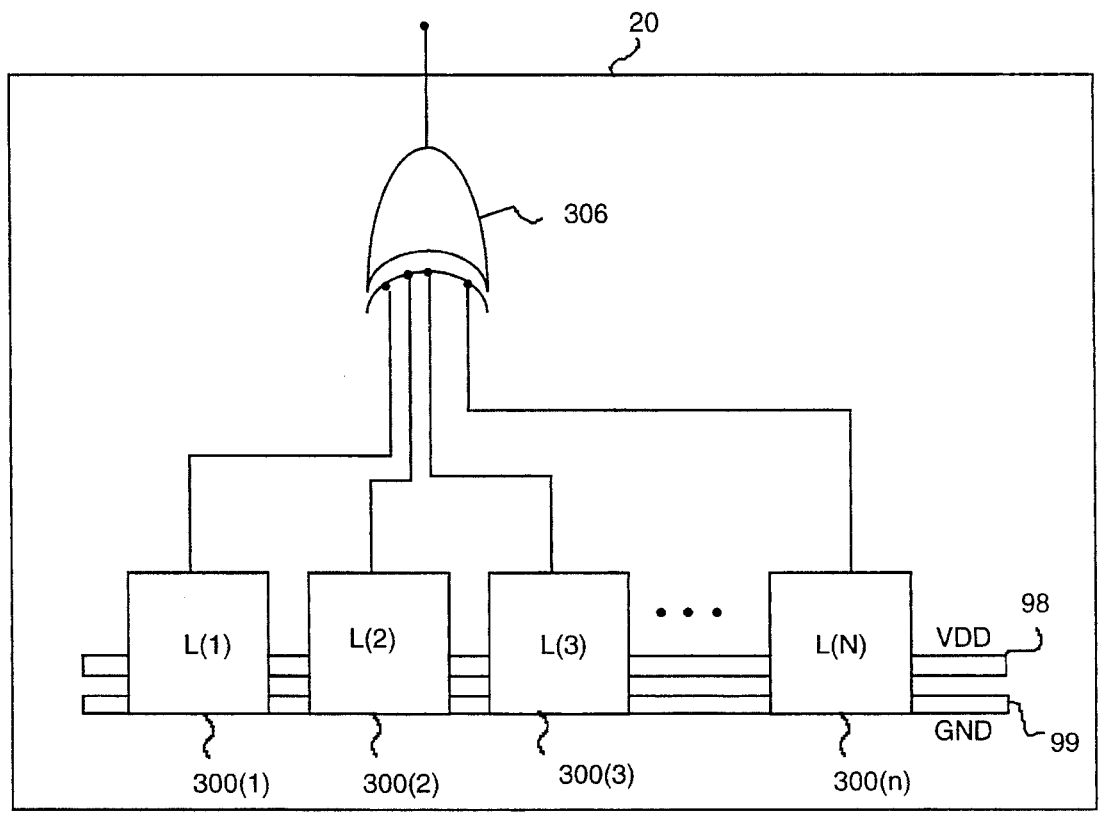
FIG. 6 is an illustration of a ROM cell configured in accordance with a second embodiment of the invention.

FIG. 6 is a block diagram of ROM cell 20 configured in an accordance with a second embodiment of the invention. Circuits 300(1) through (n) are each coupled to Vdd source 98 and Ground source 99 and have their outputs applied to the inputs of exclusive-or gate 306. The output of exclusive-or gate 306 forms the source of output node 22 of FIG. 2. Each of circuits 300(1) through (n) can be configured in a first state or a second state via modification of a single substance layer that is different for each circuit. Each circuit 300(1) through (n) generates a signal that is in a first logic level when in the first state and in a second logic level when in the second state. The result is that the logic level of the output of exclusive-or gate 306 will depend on whether an odd or even number of circuits 300(1) through (n) are in the first state.

Figure 7:
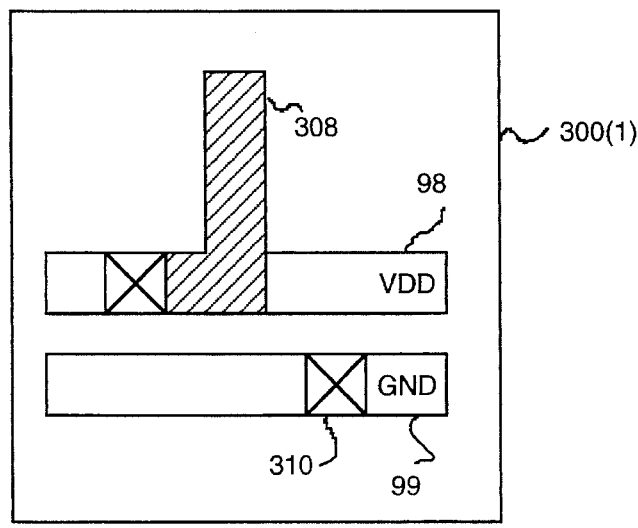
FIG. 7 is an illustration of the layout of a circuit used to implement the ROM cell when configured in accordance with the second embodiment.

FIG. 7 is an illustration of the layout of circuit 300(1) configured in accordance with the second embodiment of the invention. Metal one section 308 is coupled to Vdd source 98 at one end, and to one of the inputs of exclusive-or gate 306 of FIG. 6 at the other end. To change the state of circuit 300(1) metal one section 308 is removed and replaced with a new metal one section that has one end coupled to Ground source 99 via contact 310 and the other end coupled to the same input of exclusive or gate 306. This causes the output of circuit 300(1) to change from logic high to logic low via the alteration of a single substance layer, which in this case is metal one. The other circuits 300(2) through (n) are configured similarly to circuit 300(1) except that metal one section 308 is made from a conductive substance layer other than metal one.

The second embodiment of ROM cell 20 provides similar functionality to the first. It permanently places a node within an integrated circuit at a particular logic level, but can be altered during subsequent design revisions of the integrated circuit an infinite number of times via modification of any one of a set of substance layers. This allows binary number generated by a ROM circuit implemented using ROM cells 20 to be updating during each design revision without requiring any additional substance layers to be modified other than those necessary to perform the desired design revision. While the first embodiment of the invention is generally preferred because it uses no active logic circuitry, in situations where the use of active logic circuitry is desirable the second embodiment is preferred.

Thus, a ROM circuit that can be updated an infinite number of times via modification of any one of a set of conductive substance layers used to fabricate an integrated circuit is described. It is understood that alternative embodiments of the invention will be apparent to those skilled in the art. The exemplary embodiments described above are provided for illustrative purposes only and should not be taken as limiting the scope or the invention.

I claim:

1. A method for storing data within an integrated circuit comprising the steps of:

a) configuring a plurality of circuits that can be placed in a first state or a second state via modification of a single substance layer that is different for each circuit to have either an odd or even number of said circuits in said first state; and b) placing an output node in a first logic state or a second logic state depending on whether an odd or even number of said plurality of circuits are in said first state.

2. The method as described in claim 1 wherein step b) is comprised of the steps of:

b.1) generating a first signal in said first logic state when a first circuit from said plurality of circuits is in said first state, and in said second logic state when said first circuit is in said second state; and b.2) generating a second signal that is logically inverted with respect to said first signal when a second circuit from said plurality of circuits is in said first state, and which is logically equivalent to said first signal when said second circuit is in said second state.

3. The method as described in claim 2 further comprising the step of:

generating an alternative first signal in said second logic state when said first circuit is in said first state, and in said first logic state when said first circuit is in said second state.

4. The method as described in claim 3 wherein step b.2) comprises the step of:

applying said first signal to said output node through said second circuit when said second circuit is in said first state and applying said alternative first signal to said output node through said second circuit when said second circuit is in said second state.

5. The method as described in claim 2 wherein step b) further comprises the steps of:

b.3) generating a third signal that is logically inverted with respect to said second signal when a third circuit from said plurality of circuits is in said first state, and which is logically equivalent to said second signal when said third circuit is in said second state.

6. The method as described in claim 5 further comprising the step of:

applying said third signal to said output node.

7. The method as described in claim 1 where step b) is comprised of the step of:

coupling each of said plurality of circuit to an exclusive-or gate.

8. A circuit placed within an integrated circuit for storing data within the integrated circuit comprising:

a plurality of circuits that can be permanently placed in a first state or a second state via modification of a single substance layer that is different for each circuit; and means for placing an output node in a first logic state or a second logic state depending on whether an odd or even number of said plurality of circuits are in said first state.

9. The circuit as described in claim 8 wherein said means for placing is comprised of:

means for generating a first signal in said first logic state when a first circuit in said plurality of circuits is in said first state, and in said second logic state when said first circuit is in a second state; and means for generating a second signal that is logically inverted with respect to said first signal when a second circuit from said plurality of circuits is in said first state, and which is logically equivalent to said first signal when said second circuit is in said second state.

10. The circuit as described in claim 9 further comprising:

means for generating an alternative first signal in said second logic state when said first circuit from said plurality of circuits is in said first state, and in said first logic state when said first circuit is in said second state.

11. The circuit as described in claim 10 wherein said means for generating a second signal comprises:

means for applying said first signal to said output node through said second circuit when said second circuit is in said first state and applying said alternative first signal to said output node through said second circuit when said second circuit is in said second state.

12. The circuit as described in claim 9 further comprising:

means for generating a third signal that is logically inverted with respect to said second signal when a third circuit from said plurality of circuits is in said first state, and which is logically equivalent to said second signal when said third circuit is in said second state.

13. The circuit as described in claim 12 further comprising:

means for applying said third signal to said output node.

14. The circuit as described in claim 8 where means for placing comprises:

an exclusive-or gate coupled to each of said plurality of circuits.

15. A circuit placed within an integrated circuit for storing data within the integrated circuit comprising:

a plurality of circuits that can be placed in a first state or a second state via modification of a single substance layer that is different for each circuit; and signal generation circuit for placing an output node in a first logic state or a second logic state depending on whether an odd or an even number of said plurality of circuits are in said first state.

16. The circuit as described in claim 15 wherein said signal generation circuit is comprised of:

a first circuit from said plurality of circuits for generating a first signal in said first logic state when in said first state, and in said second logic state when in a second state; and a second circuit from said plurality of circuits for generating a second signal that is inverted with respect to said first signal when in said first state, and that is logically equivalent to said first signal in said second state.

17. The circuit as described in claim 16 wherein:

said first circuit generates an alternative first signal in said second logic state when in said first state, and in said first logic state when in said second state.

18. The circuit as described in claim 17 wherein said second circuit applies said first signal to said output node when in said first state, and applies said alternative first signal to said output node when in said second state.

19. The circuit as described in claim 9 further comprising:

a third circuit from said plurality of circuits for generating a third signal that is logically inverted with respect to said second signal when in said first state, and that is logically equivalent to said second signal when in said second state.

20. The circuit as described in claim 19 further comprising:

output circuit for applying said third signal to said output node.

21. The circuit as described in claim 15 where means for placing comprises:

an exclusive-or gate coupled to each of said plurality of circuits.

22. A method for storing data within an integrated circuit comprising the steps of:

a) configuring a plurality of circuits that can be placed in a first state or second state via modification of a single substance layer that is different for each circuit to have either an odd or even number of said circuits in said first state depending on the data being stored;

b) generating a first signal in a first logic state when a first circuit from said plurality of circuits is in said first state, and in said second logic state when said first circuit is in said second state;

c) generating an alternative first signal in said second logic state when said first circuit is in said first state, and in said first logic state when said first circuit is in said second state; and d) applying said first signal to an output node through a second circuit when said second circuit is in said first state, and applying said alternative first signal to said output node through said second circuit when said second circuit is in said second state.

23. A circuit placed within an integrated circuit for storing data within the integrated circuit comprising:

a plurality of circuits that can be permanently placed in a first state or second state via modification of a single substance layer that is difference for each circuit;

means for generating first signal in said first logic state when a first circuit in said plurality of circuits is in said first state and in second logic state when said first circuit is in second state;

means for generating an alternative first signal in said second logic state when said first signal from said plurality of circuits is in said first state, and in said first logic state when said first circuit is in said second state; and means for generating a second signal that is logically equivalent to said first signal when a second circuit from said plurality of circuits is in said first state, and which is logically equivalent to said alternative first signal when said second circuit is in said second state.

\* \* \* \* \*